United States Patent
Hong et al.

(10) Patent No.: US 6,630,405 B1
(45) Date of Patent: Oct. 7, 2003

(54) METHOD OF GATE PATTERNING FOR SUB-0.1 μM TECHNOLOGY

(75) Inventors: Lai Weng Hong, Singapore (SG); Alex See, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/467,136

(22) Filed: Dec. 20, 1999

(51) Int. Cl.$^7$ ............................................ H01L 21/302
(52) U.S. Cl. ...................................... 438/710; 438/720
(58) Field of Search ................................ 438/706, 710, 438/720, 725, 745, 754

(56) References Cited

U.S. PATENT DOCUMENTS

| | | | |
|---|---|---|---|
| 5,438,006 A | 8/1995 | Chang et al. | 437/40 |
| 5,705,414 A | 1/1998 | Lustig | 437/41 GS |
| 5,897,366 A | 4/1999 | Shiralagi et al. | 438/604 |
| 5,924,001 A | 7/1999 | Yang et al. | 438/592 |
| 5,930,642 A * | 7/1999 | Moore et al. | 438/407 |
| 5,986,311 A * | 11/1999 | Aihara | 257/382 |

OTHER PUBLICATIONS

Y.C. King et al., "Sub–5nm Multiple–Thickness Gate Oxide Technology Using Oxygen Implantation," IEDM Tech. Dig., p. 21–1.

* cited by examiner

*Primary Examiner*—Kin-Chan Chen
(74) *Attorney, Agent, or Firm*—George O. Saile; Rosemary L. S. Pike; Stephen G. Stanton

(57) ABSTRACT

A method of gate patterning, including the following steps. A semiconductor structure having an upper silicon layer is provided. The semiconductor structure has a gate conductor region. A first gate oxide layer is formed over the semiconductor structure. A polysilicon layer is formed over the first gate oxide layer. A patterned oxide mask and photoresist layer are formed over the polysilicon layer within the gate conductor region leaving unmasked polysilicon layer portions and unmasked first gate oxide layer portions. An oxygen implant is conducted within the unmasked polysilicon layer portions proximate the unmasked first gate oxide layer portions. The patterned photoresist mask is removed. The structure is annealed to form second gate oxide portions within the unmasked polysilicon layer portions over the unmasked first gate oxide layer portions. The unmasked polysilicon layer portions are etched and removed to the second gate oxide portions forming a polysilicon gate conductor within the gate conductor region.

22 Claims, 1 Drawing Sheet

METHOD OF GATE PATTERNING FOR SUB-0.1 µM TECHNOLOGY

BACKGROUND OF THE INVENTION

Gate patterning is obtained by etching polysilicon on silicon oxide, or the gate oxide. With the continued scaling of the gate oxide into the sub-20 Å regime with sub-0.1 µm technology, it is becoming increasingly difficult to ensure that the gate polysilicon etch does not also etch through the gate oxide and damaging the underlying substrate.

U.S. Pat. No. 5,924,001 to Yang et al. describes a method for fabricating polycide gate electrodes wherein voids at the silicide/polysilicon interface are eliminated by ion implantation. A hard mask layer is deposited over the silicide layer that overlies the polysilicon gate conductor.

U.S. Pat. No. 5,897,366 to Shiralagi et al. describes a method of resistless gate metal etch in the formation of a field effect transistor.

U.S. Pat. No. 5,705,414 to Lustig describes a method of fabricating a gate electrode for a MOS (metal oxide semiconductor) transistor using a spacer/hardmask gate patterning process.

U.S. Pat. No. 5,438,006 to Chang et al. describes a process of fabricating an integrated circuit device having a reduced-height gate stack by using a patterned oxide hard mask to pattern the underlying metal layer. The oxide hard mask is removed and the patterned metal is used as a mask to etch the polysilicon layer.

"Sub-5 nm Multiple-Thickness Gate Oxide Technology Using Oxygen Implantation," Y. C. King, C. Kuo, T. J. King, and C. Hu; IEDM Tech. Dig., p. 21–1, 1998 describes a process of a moderate oxygen implantation followed by a moderate anneal within a polysilicon layer to form a layer of high-quality oxide having a thickness from 30–50 Å within the polysilicon layer.

SUMMARY OF THE INVENTION

Accordingly, it is an object of the present invention to provide a method of gate patterning for sub-20 Å gate oxide regime.

Another object of the present invention is to provide a method of forming a gate oxide without etching through the gate oxide and damaging the underlying substrate when etching the polysilicon layer to form the polysilicon gate conductor.

Yet another object of the present invention is to provide a smaller rule polysilicon-on-oxide etch method without requiring a new etch chemistry or additional mask sets.

Other objects will appear hereinafter.

It has now been discovered that the above and other objects of the present invention may be accomplished in the following manner. Specifically, a semiconductor structure having an upper silicon layer is provided. The semiconductor structure has a gate conductor region. A first gate oxide layer is formed over the semiconductor structure. A polysilicon layer is formed over the first gate oxide layer. A patterned oxide mask and photoresist layer are formed over the polysilicon layer within the gate conductor region leaving unmasked polysilicon layer portions and unmasked first gate oxide layer portions. An oxygen implant is conducted within the unmasked polysilicon layer portions proximate the unmasked first gate oxide layer portions. The patterned photoresist mask is removed. The structure is annealed to form second gate oxide portions within the unmasked polysilicon layer portions over the unmasked first gate oxide layer portions. The unmasked polysilicon layer portions are etched and removed to the second gate oxide portions forming a polysilicon gate conductor within the gate conductor region.

BRIEF DESCRIPTION OF THE DRAWINGS

The features and advantages of the method of forming a gate oxide according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

A summary of the steps for gate patterning in accordance with the preferred embodiment of the present invention is:

1) Forming a gate oxide layer having a first predetermined thickness over a silicon substrate;
2) Forming a polysilicon layer over the gate oxide layer;
3) Depositing a hard mask layer over the polysilicon layer;
4) Forming a photoresist layer over the hard mask layer and patterning the hard mask layer to form a hard mask over a portion of the polysilicon layer;
5) Implanting $O_2$ using the hard mask as an ion implantation (I/I) mask to place $O_2^{-2}$ ions adjacent the gate oxide layer;
6) Removing the photoresist layer;
7) Annealing the structure to increase the thickness of the gate oxide layer not masked to a second predetermined thickness;
8) Etching the polysilicon layer to form a polysilicon gate conductor with the thicker, unmasked gate oxide layer acting as an etch stop layer.

Figure 1:
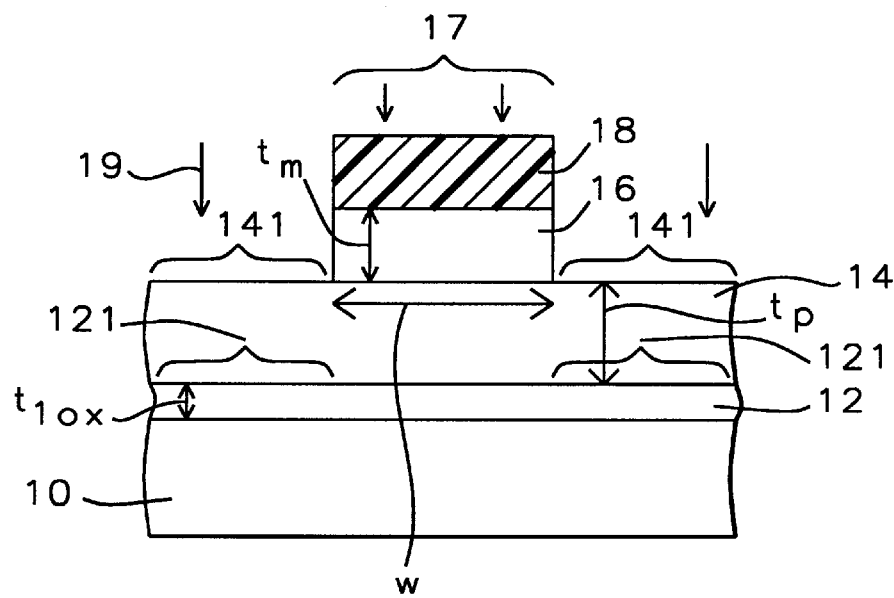
FIGS. 1–3 schematically illustrate in cross-sectional representation a preferred embodiment of the present invention.

Accordingly as shown in FIG. 1, starting semiconductor structure 10 includes an upper silicon layer and is understood to possibly include a semiconductor wafer or substrate, active and passive devices formed within the wafer. The term "semiconductor structure" is meant to include devices formed within a semiconductor wafer and the layers overlying the wafer. Unless otherwise specified, all structures, layers, etc. may be formed or accomplished by conventional methods known in the prior art.

Semiconductor structure 10 has a gate conductor region 17 having a width w from about 800 to 2000 Å, and more preferably from about 1000 to 1500 Å.

Gate oxide layer 12 is formed over semiconductor structure 10 to a thickness $t_{1ox}$ from about 15 to 20 Å. Gate oxide layer 12 is preferably thermally grown silicon oxide.

Polysilicon layer 14 is then formed over gate oxide layer 12 to a thickness $t_p$ from about 1000 to 2000 Å.

A silicon oxide layer is formed over polysilicon layer 14. A photoresist layer is formed over the silicon oxide layer to a thickness from about 1500 to 2000 Å. The silicon oxide layer is patterned to form oxide mask 16, and photoresist mask 18, over the portion of polysilicon layer 14 within gate area 17 and forming unmasked polysilicon layer portions 141 and unmasked gate oxide portions 121.

Oxide mask 16 has a thickness $t_m$ from about 100 to 150 Å.

An oxygen implantation 19 is then conducted from about 10 to 35 keV to a concentration of from about $10^{14}$ to $10^{16}$ $O_2^{-2}$ molecules $cm^2$ proximate unmasked gate oxide layer 121. Photoresist mask 18 and oxide mask 16 act as ion implantation masks over the structure.

Figure 2:
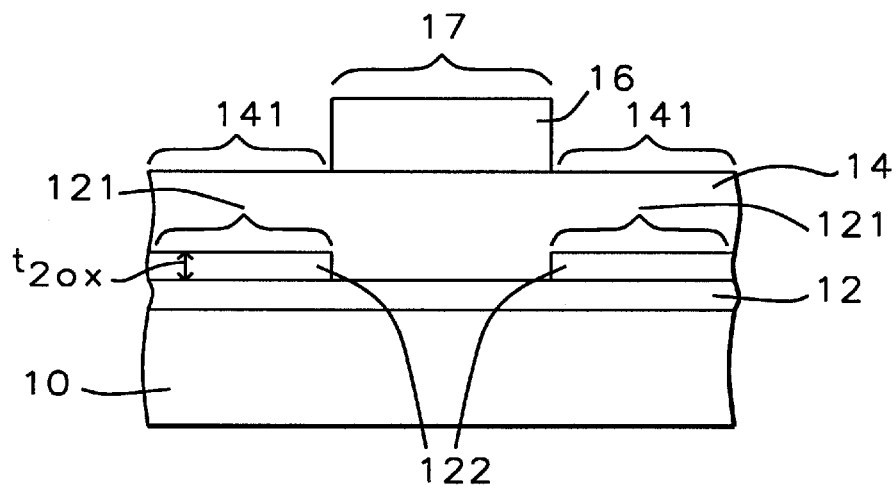

As shown in FIG. 2, photoresist layer 18 is removed.

An anneal is then performed at about 450 to 550° C. for about 100 to 140 minutes and more preferably at about 500° C. for about 2 hours which forms high-quality gate oxide layer portions 122 over unmasked gate oxide layer 121. Gate oxide layer portions 122 have a thickness $t_{2ox}$ from about 10 to 35 Å. Where gate oxide layer portions 122 overlie gate oxide layer 12, they form a uniform, indistinguishable layer of gate oxide from about 30–50 Å thick.

Gate oxide layer portions 122 have a sufficient thickness to act as an etch stop layer for the subsequent etching of unmasked polysilicon layer 141, thus protecting underlying semiconductor structure 10.

Figure 3:
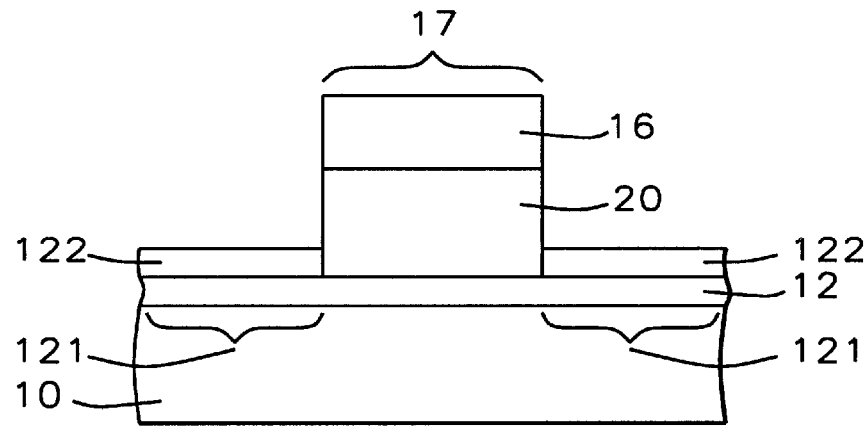

As shown in FIG. 3, oxide mask 16 serves to mask polysilicon layer 14 during an etch which forms polysilicon gate conductor 20. Gate oxide layer portions 122 serve as etch stops during unmasked polysilicon layer 141 etch protecting underlying semiconductor structure 10.

Gate oxide layer portions 122 and unmasked gate oxide layer 121 may then be removed leaving thin gate oxide layer 12 under polysilicon gate conductor 20. Oxide mask 16 may also be removed. Fabrication of a transistor having polysilicon gate conductor 20 may then continue (not shown).

The method of the present invention permits formation of an ultrathin ($\leq 20$ Å thick) gate oxide layer 12 under a gate conductor, which is required for sub-0.1 µm technology, without the need for a new etch chemistry or additional mask sets.

While particular embodiments of the present invention have been illustrated and described, it is not intended to limit the invention, except as defined by the following claims.

We claim:

1. A method of gate patterning, including the sequential steps of:
   providing a semiconductor structure having an upper silicon layer; said semiconductor structure having a gate conductor region;
   forming a first gate oxide layer over said semiconductor structure;
   forming a gate conductor layer on said first gate oxide layer;
   forming a patterned oxide mask and photoresist layer over said gate conductor layer within said gate conductor region leaving unmasked gate conductor layer portions and unmasked first gate oxide layer portions;
   conducting a oxygen implant within said unmasked gate conductor layer portions proximate said unmasked first gate oxide layer portions;
   removing said patterned photoresist mask;
   annealing the structure to form second gate oxide portions within said unmasked gate conductor layer portions over said unmasked first gate oxide layer portions; and
   using said second gate oxide portions as an etch stop, etching and removing said unmasked gate conductor layer portions to said second gate oxide portions forming a gate conductor within said gate conductor region.

2. The method of claim 1, wherein said gate conductor region has a width from about 1000 to 2000 Å and said gate conductor layer has a thickness of from about 1000 to 2000 Å.

3. The method of claim 1, wherein said first gate oxide layer is from about 15 to 20 Å thick and said second gate oxide layer portions are from about 10 to 35 Å thick.

4. The method of claim 1, wherein said first gate oxide layer is from about 16 to 19 Å thick and said second gate oxide layer portions are from about 20 to 25 Å thick.

5. The method of claim 1, wherein said oxygen implant step is conducted from about 10 to 35 keV to a concentration of from about $10^{14}$ to $10^{16}$ $O_2^{-2}$ molecules $cm^2$, and said annealing step is conducted at from about 450 to 550° C. for from about 100 to 140 minutes.

6. The method of claim 1, wherein said oxygen implant step is conducted from about 20 to 25 keV to a concentration of about $10^{15}$ $O_2^{-2}$ molecules $cm^2$, and said annealing step is conducted at from about 475 to 525° C. for from about 110 to 130 minutes.

7. A method of gate patterning, including the sequential steps of:
   providing a semiconductor structure having an upper silicon layer; said semiconductor structure having a gate conductor region; said gate conductor region having a width from about 1000 to 2000 Å;
   forming a first gate oxide layer over said semiconductor structure;
   forming a gate conductor layer on said first gate oxide layer; said gate conductor layer having a thickness of from about 1000 to 2000 Å;
   forming a patterned oxide mask and photoresist layer over said gate conductor layer within said gate conductor region leaving unmasked gate conductor layer portions and unmasked first gate oxide layer portions;
   conducting a oxygen implant within said unmasked gate conductor layer portions proximate said unmasked first gate oxide layer portions;
   removing said patterned photoresist mask;
   annealing the structure to form second gate oxide portions within said unmasked gate conductor layer portions over said unmasked first gate oxide layer portions; and
   using said second gate oxide portions as an etch stop, etching and removing said unmasked gate conductor layer portions to said second gate oxide portions forming a gate conductor within said gate conductor region.

8. The method of claim 7, wherein said first gate oxide layer is from about 15 to 20 Å thick and said second gate oxide layer portions are from about 10 to 35 Å thick.

9. The method of claim 7, wherein said first gate oxide layer is from about 16 to 19 Å thick and said second gate oxide layer portions are from about 20 to 25 Å thick.

10. The method of claim 7, wherein said oxygen implant step is conducted from about 10 to 35 keV to a concentration of from about $10^{14}$ to $10^{16}$ $O_2^{-2}$ molecules $cm^2$, and said annealing step is conducted at from about 450 to 550° C. for from about 100 to 140 minutes.

11. The method of claim 7, wherein said oxygen implant step is conducted from about 20 to 25 keV to a concentration of about $10^{15}$ $O_2^{-2}$ molecules $cm^2$, and said annealing step is conducted at from about 475 to 525° C. for from about 110 to 130 minutes.

12. A method of gate patterning, including the sequential steps of:
   providing a semiconductor structure having an upper silicon layer; said semiconductor structure having a gate conductor region;
   forming a first gate oxide layer over said semiconductor structure; said first gate oxide layer having a thickness from about 15 to 20 Å;
   forming a gate conductor layer on said first gate oxide layer;

forming a patterned oxide mask and photoresist layer over said gate conductor layer within said gate conductor region leaving unmasked gate conductor layer portions and unmasked first gate oxide layer portions;

conducting a oxygen implant within said unmasked gate conductor layer portions proximate said unmasked first gate oxide layer portions;

removing said patterned photoresist mask;

annealing the structure to form second gate oxide portions within said unmasked gate conductor layer portions over said unmasked first gate oxide layer portions; said second gate oxide portions having a thickness from about 10 to 35 Å; and using said second gate oxide portions as an etch stop, etching and removing said unmasked gate conductor layer portions to said second gate oxide portions forming a gate conductor within said gate conductor region.

13. The method of claim 12, wherein said gate conductor region has a width from about 1000 to 2000 Å and said gate conductor layer has a thickness of from about 1000 to 2000 Å.

14. The method of claim 12, wherein said first gate oxide layer is from about 16 to 19 Å thick and said second gate oxide layer portions are from about 20 to 25 Å thick.

15. The method of claim 12, wherein said oxygen implant step is conducted from about 10 to 35 keV to a concentration of from about $10^{14}$ to $10^{16}$ $O_2^{-2}$ molecules $cm^2$, and said annealing step is conducted at from about 450 to 550° C. for from about 100 to 140 minutes.

16. The method of claim 12, wherein said oxygen implant step is conducted from about 20 to 25 keV to a concentration of about $10^{15}$ $O_2^{-2}$ molecules $cm^2$, and said annealing step is conducted at from about 475 to 525° C. for from about 110 to 130 minutes.

17. A method of gate patterning, including the sequential steps of:

providing a structure having an upper silicon layer; said structure having a gate conductor region;

forming a first gate oxide layer over said structure;

forming a gate conductor layer on said first gate oxide layer;

forming a patterned mask over said gate layer within said gate conductor region leaving unmasked gate layer portions and unmasked first gate oxide layer portions;

conducting a oxygen implant within said unmasked gate conductor layer portions proximate said unmasked first gate oxide layer portions;

annealing the structure to form second gate oxide portions within said unmasked gate conductor layer portions over said unmasked first gate oxide layer portions; and using said second gate oxide portions as an etch stop, etching and removing said unmasked gate conductor layer portions to said second gate oxide portions forming a gate conductor within said gate conductor region.

18. The method of claim 17, wherein said gate conductor region has a width from about 1000 to 2000 Å and said gate conductor layer has a thickness of from about 1000 to 2000 Å.

19. The method of claim 17, wherein said first gate oxide layer is from about 15 to 20 Å thick and said second gate oxide layer portions are from about 10 to 35 Å thick.

20. The method of claim 17, wherein said first gate oxide layer is from about 16 to 19 Å thick and said second gate oxide layer portions are from about 20 to 25 Å thick.

21. The method of claim 17, wherein said oxygen implant step is conducted from about 10 to 35 keV to a concentration of from about $10^{14}$ to $10^{16}$ $O_2^{-2}$ molecules $cm^2$, and said annealing step is conducted at from about 450 to 550° C. for from about 100 to 140 minutes.

22. The method of claim 17, wherein said oxygen implant step is conducted from about 20 to 25 keV to a concentration of about $10^{15}$ $O_2^{-2}$ molecules $cm^2$, and said annealing step is conducted at from about 475 to 525° C. for from about 110 to 130 minutes.

* * * * *